(12) United States Patent
Lin et al.

(10) Patent No.: US 9,570,128 B2
(45) Date of Patent: Feb. 14, 2017

(54) MANAGING SKEW IN DATA SIGNALS

(71) Applicant: Cavium, Inc., San Jose, CA (US)

(72) Inventors: David Da-Wei Lin, Westborough, MA (US); Edward Wade Thoenes, Cambridge, MA (US); Thucydides Xanthopoulos, Watertown, MA (US)

(73) Assignee: Cavium, Inc., San Jose, CA (US)

( * ) Notice: Subject to any disclaimer, the term of this patent is extended or adjusted under 35 U.S.C. 154(b) by 104 days.

(21) Appl. No.: 14/541,952

(22) Filed: Nov. 14, 2014

(65) Prior Publication Data

US 2016/0141012 A1    May 19, 2016

(51) Int. Cl.
    *G06F 11/00*    (2006.01)
    *G11C 7/22*    (2006.01)
    *G11C 7/10*    (2006.01)

(52) U.S. Cl.
    CPC ............. *G11C 7/22* (2013.01); *G11C 7/1078* (2013.01); *G11C 7/1093* (2013.01); *G11C 2207/2254* (2013.01)

(58) Field of Classification Search
    CPC ................................ G11C 7/22; G11C 7/1078
    USPC ......................................................... 713/503
    See application file for complete search history.

(56) References Cited

U.S. PATENT DOCUMENTS

| | | | |
|---|---|---|---|
| 7,209,531 B1 | 4/2007 | Katz et al. | |
| 8,081,527 B1 | 12/2011 | Venkataraman et al. | |
| 9,349,434 B1 | 5/2016 | Lin et al. | |
| 2003/0117864 A1* | 6/2003 | Hampel | G11C 7/10 365/200 |
| 2003/0122696 A1* | 7/2003 | Johnson | G11C 7/1072 341/120 |
| 2007/0282555 A1* | 12/2007 | Chong | G01R 31/3191 702/107 |
| 2009/0168559 A1* | 7/2009 | Seo | G06F 13/4072 365/189.15 |
| 2009/0276559 A1 | 11/2009 | Allen, Jr. | |
| 2010/0008158 A1* | 1/2010 | Swain | G11C 5/04 365/189.07 |
| 2012/0206181 A1* | 8/2012 | Lin | H03K 5/135 327/199 |
| 2013/0141994 A1* | 6/2013 | Ito | G11C 7/22 365/193 |
| 2014/0321229 A1* | 10/2014 | Duffner | G11C 7/1009 365/233.13 |
| 2015/0012718 A1* | 1/2015 | Gupta | G06F 1/08 711/167 |
| 2015/0103608 A1* | 4/2015 | Miyano | G11C 11/413 365/194 |

(Continued)

*Primary Examiner* — Vincent Tran
(74) *Attorney, Agent, or Firm* — Occhiuti & Rohlicek LLP

(57) ABSTRACT

An apparatus for controlling memory includes a memory controller, and an interface to data lines connecting it to memory. Each line carries a signal that corresponds to a bit to be written to memory. The interface includes, for each line, circuitry for transmitting a bit to memory via the line, and a data de-skewer. For each line, the de-skewer receives a first data signal that represents a bit to be written. Each line has an inherent skew. The de-skewer generates a second data signal by applying a skew to the first. A selected extent of skew increases a likelihood of sampling the second data signal during a data-valid window thereof. The same de-skewer receives and skews a first data bit read from the memory.

13 Claims, 5 Drawing Sheets

(56) References Cited

U.S. PATENT DOCUMENTS

2015/0109034 A1* 4/2015 Vasudevan ................ H03L 7/08
                                                          327/156
2016/0141013 A1   5/2016 Lin et al.
2016/0141018 A1   5/2016 Lin et al.

* cited by examiner

|  | DQ Bit 0 | DQ Bit 1 | DQ Bit 2 | DQ Bit 3 | DQ Bit 4 | DQ Bit 5 | DQ Bit 6 | DQ Bit 7 |
|---|---|---|---|---|---|---|---|---|
| DQ WDSK Setting 0% | FAIL | PASS | FAIL | FAIL | FAIL | FAIL | PASS | PASS |
| DQ WDSK Setting 12.5% | PASS | PASS | PASS | FAIL | FAIL | PASS | PASS | PASS BEST |
| DQ WDSK Setting 25% | PASS | PASS | PASS | FAIL | PASS | PASS BEST | PASS BEST | PASS |
| DQ WDSK Setting 37.5% | PASS BEST | PASS BEST | PASS BEST | PASS | PASS BEST | PASS | PASS | PASS |
| DQ WDSK Setting 50% | PASS | PASS | PASS | PASS BEST | PASS | PASS | PASS | FAIL |
| DQ WDSK Setting 62.5% | PASS | PASS | PASS | PASS | PASS | FAIL | FAIL | FAIL |
| DQ WDSK Setting 75% | FAIL | PASS | PASS | FAIL | FAIL | FAIL | FAIL | FAIL |
| DQ WDSK Setting 87.5% | FAIL | PASS | FAIL | FAIL | FAIL | FAIL | FAIL | FAIL |

*FIG. 4*

MANAGING SKEW IN DATA SIGNALS

BACKGROUND

This application relates to memory controllers, and in particular, to managing skew in data signals.

In a typical memory system, a memory and a memory controller connect to a common bus that has several parallel wires. Each wire, which carries one bit, will be referred to herein as a "data line."

The signal present on each data line represents data. It will therefore be referred to herein as the "data signal." In a typical memory with eight-bit bytes, there would be eight of these data signals for every byte.

In a typical memory system, the wires that carry a byte include data lines, with one data line for each bit. Thus, for an eight-bit byte, there would be eight data lines. However, there is also an extra pair of wires. This extra wire pair carries a differential signal that functions as a reference clock for sampling the data lines. The differential signal carried by these extra wires is often called a "strobe." The wires that carry the strobe are collectively called a "strobe line."

For example, such a memory system may include a memory controller for a memory module that includes a number of synchronous dynamic random access (SDRAM) memory chips. In such a system the data line may be called a "DQ" signal, and the strobe may be called a "DQS" signal.

In the process of writing to the memory, a memory controller receives several n-bit units worth of data, together with an instruction to write those units into the memory. Each unit has n data bits and an associated strobe line. For each n-bit unit, the controller places each of the n bits on each of the n individual data lines corresponding to those n bits. As part of this task, the memory controller places a strobe on the strobe line for each n-bit unit. For each n-bit unit, the memory makes use of the strobe to sample the data lines for that unit, and stores the corresponding data into the memory array. In some embodiments, n=8. However, in other embodiments n=4.

The data lines may be bidirectional. So, in the process of reading from the memory, the controller issues one or more commands to the memory. In response, the memory places data signals on the data lines and a corresponding strobe on the strobe line. The controller then retrieves the data from the bidirectional data lines.

In the ideal case, the timing of the strobe and the data signals should be maintained with a particular relative phase offset while propagating between the controller and the memory. However, in practice, different data lines have different skews in the data signals. These different skews, which result in different relative phase offsets, arise as a result of variations in the path-lengths of the routes followed by the data signals as they traverse the package that contains a memory component, a module containing multiple packaged memory components, a printed circuit board that connects the controller to the memory module, and the package of the memory controller. For example, temperature may also cause such variations. As a result of higher data rates, the effects of these variations are more significant.

SUMMARY

In one aspect, the invention features an apparatus for controlling a memory. Such an apparatus includes a memory controller, and an interface to data lines connecting the memory controller to the memory. Each of the data lines carries a signal that corresponds to a bit of a byte that is to be written to the memory. The interface includes, for each of the data lines, circuitry for transmission of a bit to be written into the memory via the data line, and for each of the data lines, a data de-skewer. For each of the data lines, the data de-skewer is configured to receive a first data signal that represents a bit that is to be written into the memory. Each of the data lines is associated with an inherent skew. The data de-skewer applies a compensation skew to the first data signal to generate a second data signal. An extent of this compensation skew is selected to increase a likelihood that the second data signal will be sampled by the memory during a data-valid window thereof. The same data de-skewer is further configured to receive a first data bit that has been read from the memory and to skew the first data bit.

In some embodiments, a sum of the extent of the compensation skew and the inherent skew of the first data signal equals a total skew. The extent is selected to minimize a difference between the total skew and a skew that is common to all bits in the byte.

Other embodiments include a strobe de-skewer configured to receive a first strobe and to output a second strobe. The second strobe is to be placed on a strobe line. The strobe de-skewer is configured to skew the first strobe to an extent selected to maximize a likelihood that the second strobe will cause sampling of all data bits on the data lines during a data-valid window that is common to all of the data bits on the data lines. Among these embodiments are those in which the strobe de-skewer is configured to skew the first strobe by a value that is midway between a highest and lowest skew value of the strobe de-skewer. In some cases, the highest and lowest skew value of the strobe de-skewer and a highest and lowest skew value of the data de-skewer are the same.

Further embodiments include those that include a multiplexer having an output that is connected to an input of the data de-skewer. This multiplexer has a first input and a second input. The first input is connected to a portion of the interface configured to receive, from the data line, a signal indicative of a bit that has been read from the memory. The second input is configured to receive the first data signal. The de-skewer has an output that is selectively connected to the data line so that the second data signal can be placed on the data line. The choice of what input to select depends on whether the memory controller is reading or writing. In particular, the first input is selected when the memory controller is reading data from the memory, and the second input is selected when the memory controller is writing data into the memory.

Other embodiments include a multiplexer having a first input, a second input, and an output. The first input is configured to receive the first data signal, and the second input is configured to receive the second data signal. The output connects to circuitry configured for placing either the first or second data signal on the data line for writing into the memory.

Yet other embodiments, include a multiplexer having a first input, a second input, and an output. The first input is configured to receive the first data signal. The second input is configured to receive a signal that has been read from memory and that has been delayed. The output connects to circuitry that, when enabled, is configured for transmitting, to the memory, either the first data signal or the signal that has been read from memory.

Other embodiments include both a first and second multiplexer. The first multiplexer includes an output, a first input, and a second input. The output of the first multiplexer is connected to an input of the data de-skewer. The first input of the first multiplexer is connected to the data line to receive a signal indicative of a bit that has been read from the memory. The second input of the first multiplexer is configured to receive the first data signal. The de-skewer has an output that is selectively connected to the data line so that the second data signal can be placed on the data line. The first input of the first multiplexer is selected when the memory controller is reading data from the memory, and the second input of the first multiplexer is selected when the memory controller is writing data into memory. The second multiplexer includes a first input, a second input, and an output. The first input of the second multiplexer is configured to receive the first data signal. The second input of the second multiplexer is configured to receive the second data signal. The output of the second multiplexer connects to circuitry configured for placing either the first data signal or the second data signal on the data line for writing into the memory.

In another aspect, the invention features a method for controlling a write to a memory. Such a method includes receiving a first data signal that has been read from the memory, at a first de-skewer, applying a read-compensation skew to the first data signal, receiving a second data signal that represents a bit of a byte that is to be written to the memory, selecting a write-compensation skew, and at the first de-skewer, skewing the second data signal by the selected write-compensation skew, thereby generating a third data signal. Selecting the write-compensation skew includes selecting a skew that increases a likelihood that the third data signal will be sampled during a data-valid window thereof.

In some practices, selecting the write-compensation skew includes selecting the write-compensation skew to maximize an extent to which all third data signals associated with the byte have overlapping data-valid windows.

In other practices, selecting the write-compensation skew includes determining a compensation skew that, when added to an inherent skew in the data signal, results in a constant that is the same for all of the second data signals associated with the byte.

Other practices include, for each of a set of candidate compensation skews, applying the candidate compensation skew to data, writing the data into memory, reading the data back from memory, determining that the data read back from memory fails to match the data that was written into memory, and based on the determination, removing the compensation skew from the set of candidate compensation skews.

In another aspect, the invention features an apparatus for controlling memory. Such an apparatus includes a memory controller, and an interface to data lines connecting the memory controller to the memory. Each of the data lines carries a signal that corresponds to a bit of a byte that is to be written to the memory. The interface includes, for each of the data lines, a transmitter to drive bits to be written into the memory onto a data line coupled to the transmitter. The interface includes, for each of the data lines, a receiver to detect bits that have been read from the memory from a data line coupled to the receiver. The memory controller includes, for each of the data lines, a data de-skewer used in a writing mode and a reading mode. For each of the data lines, the data de-skewer is configured to receive a first data signal. Each of the data lines is associated with an inherent skew. The data de-skewer applies a compensation skew to the first data signal to generate a second data signal. In the writing mode the first data signal is a signal that represents a bit that is to be written into the memory, and in the reading mode the second data signal is a signal that represents a bit that has been read from the memory.

Among the embodiments are those in which, for each of the data lines, the compensation skew applied to the first data signal to generate a second data signal is obtained by training the data de-skewer in the reading mode. These include embodiments in which, for each of the data lines, the data de-skewer uses the compensation skew, which was obtained by training the data de-skewer in the reading mode, for skewing a data signal that represents a bit that is to be written into memory. These also include embodiments in which the data de-skewer is trained in the reading mode using data signals that represent bits provided the memory during normal operation thereof.

Also among the embodiments are those in which the data de-skewer is trained based on locating timing of a leading-transition interval and trailing-transition interval of data signals representing bits propagating over each data line. In some of these embodiments, locating timing of a leading-transition interval and a trailing-transition interval of a first data signal includes oversampling the first data signal based on a clock signal corresponding to the first data signal. In others, oversampling the first data signal based on the corresponding clock signal includes sampling the first data signal based on the corresponding clock signal and multiple time-shifted versions of the corresponding clock signal.

In other embodiments, for each of the data lines, the data de-skewer uses a first input value for determining the compensation skew in the reading mode, and uses a second input value, different from the first input value, for determining the compensation skew in the writing mode. Among these embodiments are those in which, for each of the data lines, the second input value is obtained by training the data de-skewer by writing test data into the memory in the writing mode and reading the test data from the memory in the reading mode using the compensation skew determined in the reading mode. These embodiments include those in which, for each of the data lines, the first input value is obtained by training the data de-skewer based on locating timing of a leading-transition interval and trailing-transition interval of a data signal representing bits propagating over the data line.

In another aspect, the invention features a method for controlling a memory. Such a method includes causing a data de-skewer to operate in a writing mode; at the data de-skewer, receiving a first signal, and skewing the first data signal by a first compensation skew; causing the data de-skewer to operate in a reading mode; at the data de-skewer, receiving a second signal, and skewing the second signal by a second compensation skew. In this method, the first signal represents a bit from a byte that is to be written to the memory, and the second signal represents a bit from a byte that has been read from the memory. Thus, the same de-skewer is being used in both directions.

Some practices include training the de-skewer while the memory is operating in the reading mode. Among these are practices in which training the de-skewer comprises generating the first compensation skew, those in which training the data de-skewer in reading mode comprises using data signals that represent bits provided by the memory during normal operation of the memory, and those in which training the data de-skewer in reading mode comprises locating a leading-transition interval and a trailing-transition interval of a data signal that represents a bit that is propagating over a data line.

In those practices that involve locating the leading-transition interval and the trailing-transition interval of the data signal, these steps include oversampling the data signal based on a clock signal, wherein the clock signal is a clock signal that corresponds to the data signal. In some of these practices, oversampling the data signal based on the corresponding clock signal comprises sampling the first data signal based on a corresponding clock signal and on multiple time-shifted versions of the corresponding clock signal.

Alternative practices of the method include those that include, for each of a plurality of data lines, causing the data de-skewer to use a first input value for determining a compensation skew in the reading mode, and causing the data de-skewer to use a second input value, different from the first input value, for determining a compensation skew in the writing mode. Among these are practices in which, for each of the data lines, obtaining the second input value by training the data de-skewer. In these practices, training the data de-skewer comprises writing test data into the memory in the writing mode, and reading the test data from the memory in the reading mode using the compensation skew determined in the reading mode. Some of these practices further include, for each of the data lines, obtaining the first input value by training the data de-skewer based on locating timing of a leading-transition interval and trailing-transition interval of a data signal representing bits propagating over the data line.

Some additional practices include selecting the first compensation skew and the second compensation skew to be equal to each other, and alternatively, selecting the first compensation skew and the second compensation skew to be different from each other.

The techniques described herein enable compensation of systematic skew that may exist between a memory and a memory controller. This may improve the setup and hold time margin for a high speed memory interface with minimal additional hardware by re-using the same compensation circuitry for de-skew of signals in both directions over bidirectional data lines. The interface includes transmitter circuitry for driving signals onto electrically conducting pathways of the data lines propagating toward the memory, and receiver circuitry for detecting signals propagating in the opposite direction from the memory over those same pathways. For example, the interface includes, for each data line, a transmitter and receiver pair that can be alternatively selected for transmission and reception, respectively. In addition to re-use of the compensation circuitry that compensates the delay skew difference among data lines, trained compensation settings can be re-used to enable dynamic re-training for both reading and writing, as described in more detail below.

These and other features of the invention will be apparent from the following description and the accompanying drawings.

BRIEF DESCRIPTION OF THE DRAWINGS

FIG. 4 shows the derivation of a compensation vector to be used for compensation of the bits in FIG. 1.

DETAILED DESCRIPTION

Figure 1:
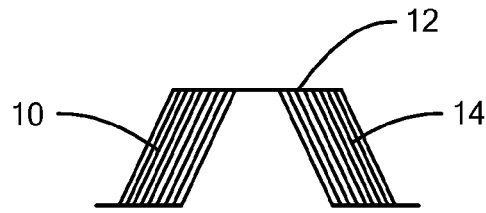
FIG. 1 shows several bits overlaid on each other to show a data-valid window.

FIG. 1 shows a superposition of bits from a data unit after having been placed on respective data lines by the controller and having reached a memory. The particular example shows a data unit with eight bits. However, the principles described herein are independent of the actual number of bits.

The superposition has three intervals: a leading-transition interval 10 during which the bits are potentially transitioning between different values, a data-valid window 12 during which all bits are held at their correct values, and a trailing-transition interval 14 during which the bits are also potentially transitioning between different values.

In the example of FIG. 1, for illustration purposes, all n bits happen to transition from low to high and then from high back to low, corresponding to a bit sequence of 010 for all n bits. Also, the terms "leading" and "trailing" are relative to a time slot for a particular bit. The trailing-transition interval of one bit is the same as the leading-transition interval of the subsequent bit.

It is apparent from the FIG. 1 that the individual bits have been skewed. As a result, the extent of each of these intervals is not the same across all data lines. Some data lines reach their data-valid window 12 earlier than others. Other data lines may start their trailing-transition interval 14 sooner than most. This tends to broaden the aggregate leading-transition interval 10 and the aggregate trailing-transition interval 14 of the collection of bits as a whole, and to do so at the expense of a now shorter aggregate data-valid window 12.

Clearly, the best time for a strobe to sample valid values for all of the bits is while all n data lines are still in their respective data-valid windows 12. Timing the strobe this way will ensure that all bits are in a state suitable for sampling.

Given the technological limits on how short the transitions of the leading-transition interval 10 and trailing-transition interval 14 can be, as clock rates have become faster, the data-valid window 12 has become shorter. Thus, it has become easier for the strobe to miss the data-valid window 12. This can result in inadvertently sampling one or more bits during the leading-transition or trailing-transition interval 10, 14 when a signal is not guaranteed to be at its correct value.

A solution to this difficulty is to de-skew the individual data signals so as to reduce the extent of the aggregate leading-transition and trailing-transition intervals 10, 14, thus extending the aggregate data-valid window 12. This would be followed by adding a skew that is required by the receiving memory between all n data bits and the strobe. The extent of the relative skew is selected to maximize the likelihood of having the memory sample the data lines during the extended aggregate data-valid window 12 thus created. In the preferred embodiment, the relative skew is caused by skewing the data relative to a fixed strobe.

A signal's timing can be controlled by passing the signal through a delay line. A delay-line has multiple delay stages $u_1, u_2, \ldots u_N$, each of which yields an output that is a delayed version of the input. The extent of this delay monotonically increases with the index $1, 2, \ldots N$ of the delay stage. To delay the signal by a particular amount, one selects an appropriate delay stage and obtains the delayed signal from the final output.

Each one of the data signals shown in FIG. 1 has an inherent skew that governs when the data-valid window 12 for that data signal begins. This skew varies from one bit to the next. Although the inherent skew cannot easily be eliminated, it can nevertheless be compensated for.

The method and apparatus disclosed herein de-skews the individual data signals shown in FIG. 1 by identifying a set of compensation skews such that the sum of a data signal's inherent skew and its compensation skew is substantially the same for each data signal. As a result, the aggregate data-valid window 12 will increase and the aggregate leading-transition and trailing-transition intervals 10, 14 will decrease. The process of identifying these compensation skews is carried out during a training procedure. This might occur, for example, when a computer is first turned on or rebooted. Once the compensation skews for each bit have all been determined, they are stored (e.g., in registers) for use during an operating procedure.

In some embodiments, the process begins by passing the strobe through a delay line and skewing it by an amount that is about midway across the range of the delay line. In other words, if the delay line applies a maximum delay of $t_{max}$ and a minimum delay of $t_{min}$, then the strobe is skewed by about $0.5*(t_{max}-t_{min})$.

Figure 2:
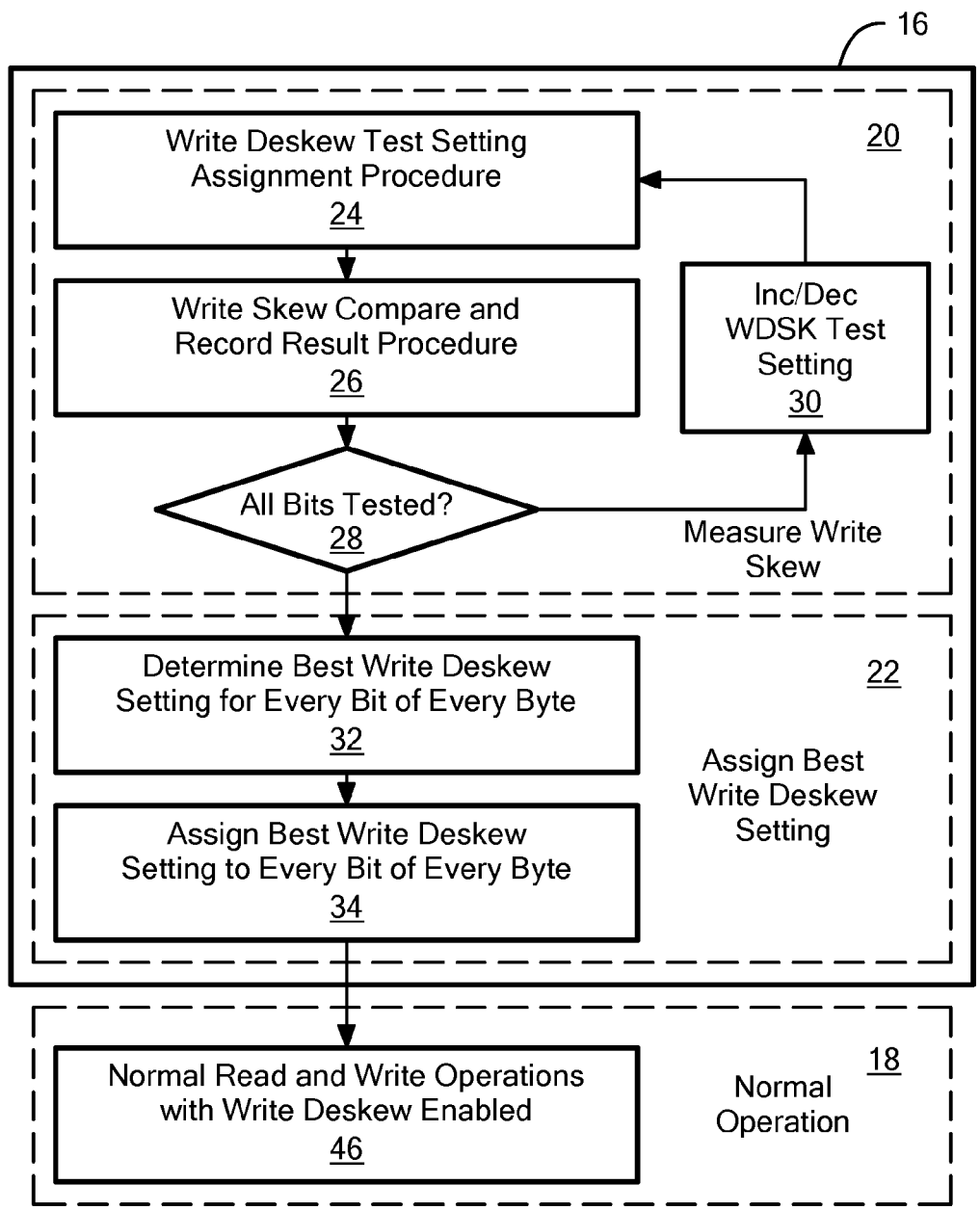
FIG. 2 shows a flow chart for carrying out a write-skewing procedure to ensure sampling during the data-valid window shown in FIG. 1.

Referring now to FIG. 2, an example of a write-de-skewing process includes a training procedure 16 and an operating procedure 18. The training procedure 16 breaks down into a measurement phase 20 and an assignment phase 22.

The measurement phase 20 includes, for each bit, sweeping across a range of compensation skews to identify an optimal compensation skew for that bit. In particular, the measurement phase 20 includes choosing a particular compensation skew (step 24), applying that compensation skew, and comparing a bit value written to the memory with a bit value read back from the memory (step 26) to see if it results in a write error. After repeating this procedure for all bits (step 28), a new compensation skew is obtained by incrementing or decrementing the old one (step 30). The procedure then begins again all over again with the new compensation skew. This procedure can be performed for multiple bytes of a memory interface concurrently. For example, bit 0 of all bytes can be tested at the same time, then bit 1 of all bytes can be tested, etc. Also, in some embodiments, instead of repeating the procedure sequentially for each bit of a byte, the error for all bits of all bytes is analyzed in parallel.

In more detail, the measurement phase 20 includes, for each value of compensation skew, causing each bit to be written into memory and then reading the bit back. If the value read back is consistent with the value written, then that compensation skew is identified as one of several possible choices for the optimal compensation skew that could be applied to that bit. This process is carried out in parallel for all bits. Expressed in pseudo-code, an example of this procedure is as follows:

```
FOR I=1..NBITS
    FOR J=1..NSKEWS
        TIME=0
        AT (TIME=J*SKEW_STEP)
        WRITE(BIT(I),MEMORY_LOCATION)
        X=READ(MEMORY_LOCATION)
        IF (X==BIT(I)) THEN WRITE(J,GOOD_LIST)
    NEXT J
NEXT I
```

The outer "FOR" loop is only shown for clarity. In practice, this procedure is carried out in parallel for all bits.

The assignment phase 22 includes examining the set of candidate passed compensation skews to determine the optimal compensation skew for each bit (step 32). These optimal compensation skews are then assigned to each bit (step 34).

At this point, the training procedure 16 is complete.

Figure 3:
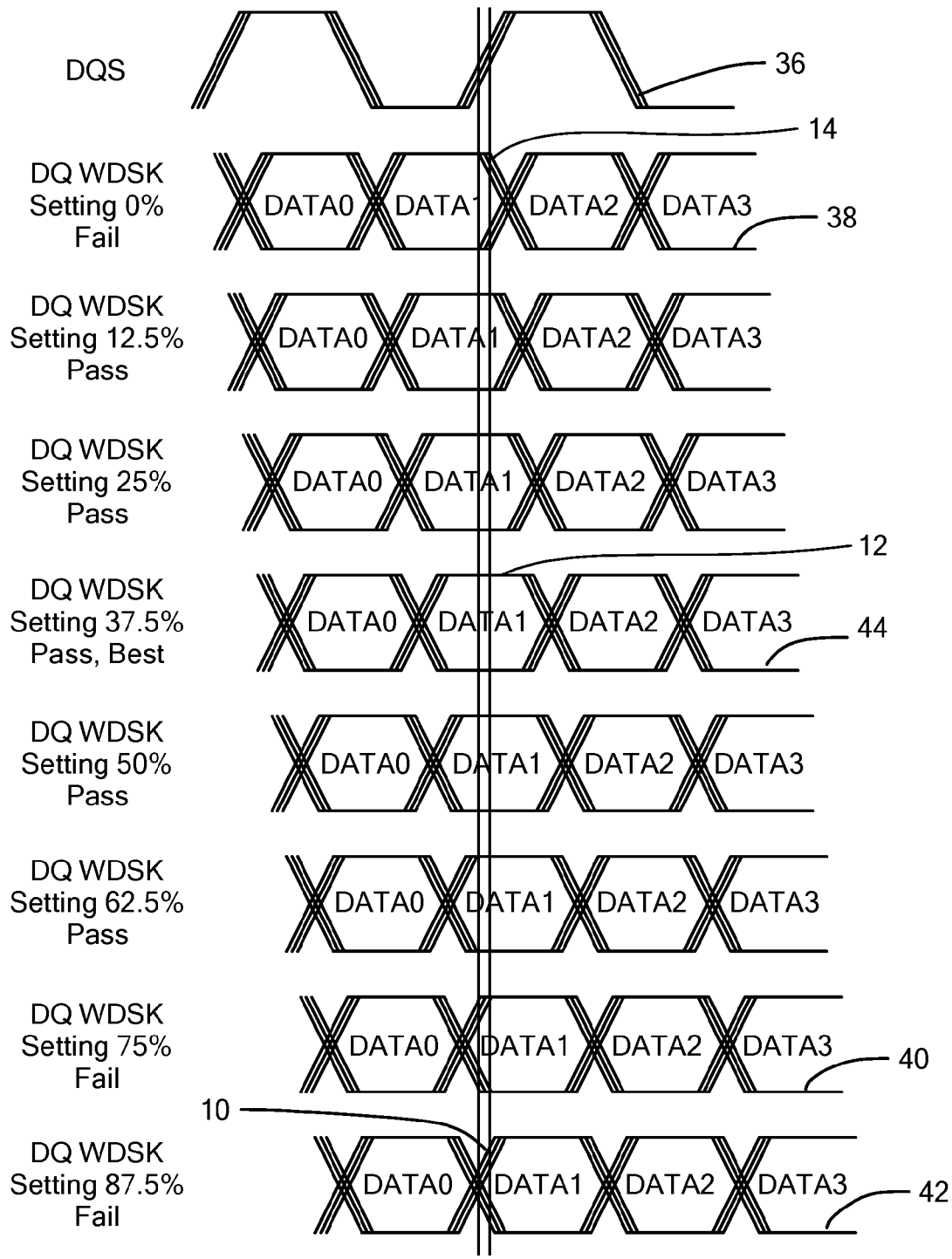
FIG. 3 shows sweeping across compensation skew settings to identify optimal compensation skew settings to enlarge the data-valid window shown in FIG. 1.

FIG. 3 illustrates the process of sweeping across the various delay settings for a first bit, as discussed in connection with the measurement phase (step 20). The topmost waveform shows a strobe 36 that has been delayed by the strobe skew defined above. The remaining eight waveforms correspond to eight settings on a delay line.

As is apparent, in a first skew setting 38, in which the data signal has sustained a compensation skew of 0% of the total compensation range of the delay line, the rising edge of the strobe, in this example, is close to the trailing-transition interval 14. In the seventh, and eight skew settings 40, 42, where the data signal has sustained compensation skews of 75% and 87.5% of the total compensation range of the delay line, the rising edge of the strobe is now close to the leading-transition interval 10. Both of these skew settings result in reading a value that is inconsistent with what was written. According to FIG. 3, the best compensation skew to apply to the first bit would be the fourth skew setting 44, which is 37.5% of the total compensation range of the delay line.

The fact that the optimal skew setting for the first bit is the fourth skew setting 44 says nothing about what the optimal skew settings might be for the other seven bits. In fact, FIG. 4 shows an example of the optimal skew settings for the first bit and the remaining seven bits. As is apparent, many of the bits are optimized by the fourth skew setting 44. However, there are some outliers. For instance, bit 7 is optimized by the second skew setting.

The result of the training procedure 16 is thus an eight-dimensional optimal compensation vector (or "de-skewing vector"), which in the case shown in FIG. 4 is [4 4 4 5 4 3 3 2]. The optimal compensation vector is then saved and applied for use in operating procedure 18.

During the operating procedure 18, normal reading and writing operations occur but with the write-skew feature enabled (step 46). The compensation skew for each bit is stored in a register associated with that bit. The compensation skew for a particular bit is then applied to that bit every time a write is to occur. Then, once the bits have all been placed on their respective data lines, the strobe is placed on the strobe line after the lapse of the strobe skew.

A method and apparatus for using a de-skewer for de-skewing data signals that are being read from a memory is described in U.S. patent application Ser. No. 14/046,879, filed on Oct. 4, 2013, the contents of which are herein incorporated by reference. The method and apparatus disclosed herein re-uses the same de-skewer that is used for de-skewing data signals that are being read from the memory for de-skewing data signals that are to be written to the memory. The de-skewer can be trained separately for reading and writing. Alternatively, a training re-use mode has the advantage of enabling a de-skewing vector determined for reading to be re-used for writing as well as reading, as described in more detail below.

Figure 5:
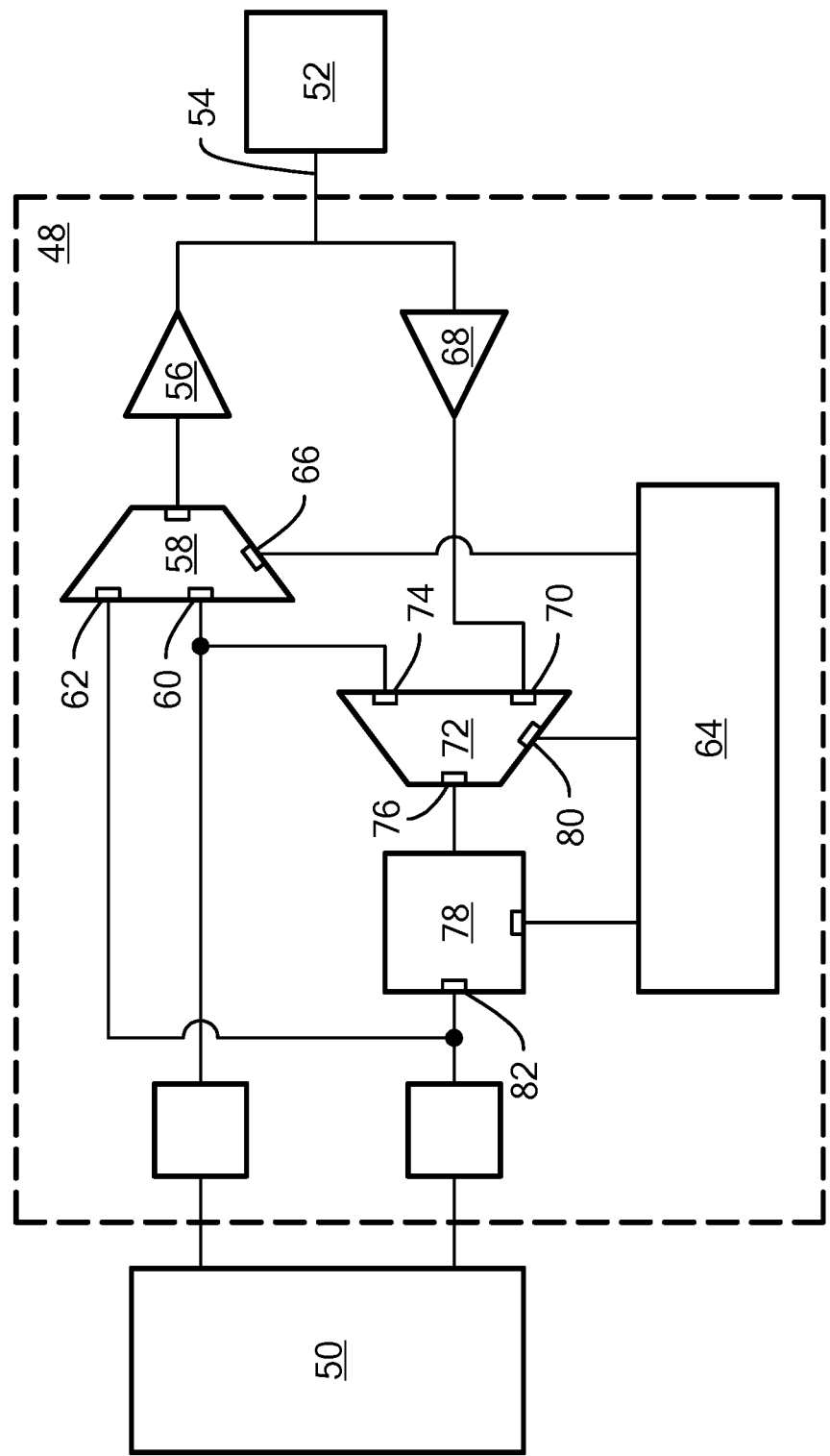
FIG. 5 shows a circuit for providing a strobe according to the procedure set forth in FIG. 2.

FIG. 5 shows a strobe-communication circuit 48 for communicating strobes between a memory controller 50 and a memory 52 via a bidirectional strobe line 54. The particular circuit shown has two modes of operation: a read mode, in which it receives a read-strobe from the memory 52, and a write mode, in which it sends a write-strobe to the memory 52.

The write mode can be a conventional write-mode or a skewed write-mode. In the conventional write-mode, the write-strobe is delayed by a nominal amount that is selected in an attempt to sample at the midpoint of a data-valid window 12. A write-strobe having this property will be referred to as a "nominal write-strobe." In the skewed write-mode, the write-strobe is first passed through a de-skewer that delays it by some predetermined amount that depends on the minimum and maximum delay of the de-skewer. This kind of write strobe will be referred to as a "skewed write-strobe."

The strobe-communication circuit 48 includes a transmitter 56 for placing a write-strobe on the strobe line 54. This write-strobe is to be provided to the memory 52 during a write operation.

A first multiplexer 58 has an output connected to the transmitter 56. The output of the first multiplexer 58 provides the write-strobe that is to be placed on the strobe line 54 by the transmitter 56. The transmitter 56 is, in some embodiments, configured to convert logic levels used by the memory controller 50 into logic levels used by the memory 52.

The first multiplexer 58 has first and second inputs 60, 62 for receiving two different versions of a write-strobe. The first input 60 receives a nominal write-strobe. The second input 62 receives a skewed write-strobe. The choice of whether to place the skewed write-strobe or the nominal write-strobe on the strobe line 54 is made by control logic 64 connected to a control input 66 of the first multiplexer 58.

The strobe-communication circuit 48 further includes a receiver 68 for receiving a read-strobe on the strobe line 54 during a read operation. The receiver 68 connects to a first input 70 of a second multiplexer 72, a second input 74 of which receives the nominal write-strobe. The receiver 68 is, in some embodiments, configured to convert logic levels used by the memory 52 into logic levels used by the memory controller 50.

The second multiplexer 72 has an output 76 that leads to a de-skewer 78. Thus, the de-skewer 78 can receive either the nominal write-strobe or a read-strobe. The choice between these two is made by a signal provided by the control logic 64 to a control input 80 of the second multiplexer 72.

When being used in connection with writing into memory, a de-skewer output 82, or the second input of the first multiplexer 58, provides a skewed strobe to the second input 62 of the first multiplexer 58. On the other hand, when being used in connection with reading from memory, the de-skewer output 82 provides the skewed strobe to whatever entity would normally use the read-strobe. The amount of skew may be fixed, or may be tuned based on a range of skew values determined for the data signals, as described below with reference to FIG. 6. In some embodiments, the amount of skew is fixed halfway between the minimum and maximum possible skews provided by the de-skewer 78.

When carrying out a read operation, the receiver 68 is active and the transmitter 56 is inactive. The control logic 64 selects the first input 70 of the second multiplexer 72. As a result, the read-strobe passes through the de-skewer 78, which then delays it by some predetermined amount. The skewed read-strobe also happens to be provided to the second input of the first multiplexer 58. However, since the transmitter 56 is inactive, this has no effect.

When carrying out a normal write-operation, the receiver 68 is inactive and the transmitter 56 is active. The control logic 64 selects the first input 60 of the first multiplexer 58. As a result, the nominal write-strobe is placed on the strobe line 54.

When carrying out a skewed write-operation, the receiver 68 is inactive and the transmitter 56 is active. The control logic 64 selects the second input 62 of the first multiplexer 58 and the second input 74 of the second multiplexer 72. This means that the signal placed on the strobe line 54 will be the output of the de-skewer 78. As it turns out, since the second input 74 receives the nominal write-strobe, the output of the de-skewer 78 will be a skewed write-strobe. As a result, a skewed write-strobe is placed on the strobe line 54.

The strobe communication circuit 48 thus offers the advantage of re-using the de-skewer 78 for both read and write operations. This saves considerable die space and reduces overall power consumption.

Figure 6:
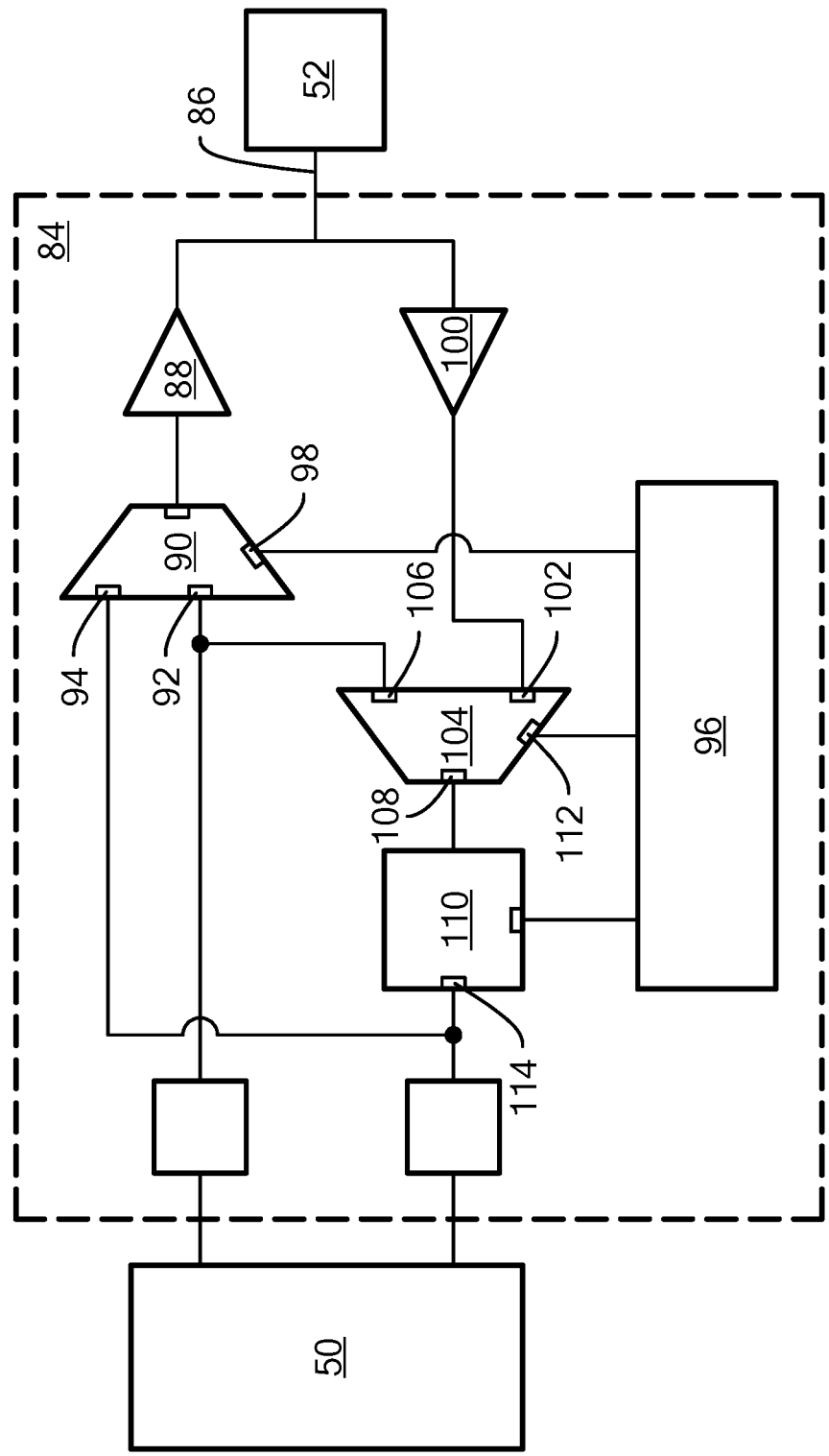
FIG. 6 shows a circuit for providing data signals according to the procedure set forth in FIG. 2.

FIG. 6 shows one of eight data-communication circuits 84 for communicating data between a memory controller 50 and a memory 52 via a bidirectional data line 86. The particular circuit shown has two modes of operation: a read mode, in which it receives a data bit from the memory 52, and a write mode, in which it sends a data bit to the memory 52.

The write mode can be a conventional write-mode or a skewed write-mode. In the conventional write-mode, the data bit to be written is not delayed on purpose. A data bit having this property will be referred to as a "nominal data-bit." In the skewed write-mode, a de-skewer has delayed the data bit to be written in an attempt to maximize the data-valid window that can be sampled by the strobe. This kind of data bit will be referred to as a "skewed data bit."

The data-communication circuit 84 includes a transmitter 88 for placing a data bit on the data line 86. This data bit is to be provided to the memory 52 during a write operation. The transmitter 88 is, in some embodiments, configured to convert logic levels used by the memory controller 50 into logic levels used by the memory 52.

A first multiplexer 90 has an output connected to the transmitter 88. The output of the first multiplexer 90 provides the data bit that is to be placed on the data line 86 by the transmitter 88.

The first multiplexer 90 has first and second inputs 92, 94 for receiving two different versions of a data bit. The first input 92 receives a nominal data-bit. The second input 94 receives a skewed data-bit. The choice of whether to place the skewed data-bit or the nominal data-bit on the data line 86 is made by control logic 96 connected to a control input 98 of the first multiplexer 90.

The data-communication circuit 84 further includes a receiver 100 for receiving a data bit on the data line 86 during a read operation. The receiver 100 connects to a first input 102 of a second multiplexer 104, a second input 106 of which receives the nominal data-bit. The receiver 100 is, in some embodiments, configured to convert logic levels used by the memory 52 into logic levels used by the memory controller 50.

The second multiplexer 104 has an output 108 that leads to a de-skewer 110. Thus, the de-skewer 110 can receive either the nominal data-bit that is to be written into memory or a data bit that has been read from memory. The choice between these two is made by a signal provided by the control logic 96 to a control input 112 of the second multiplexer 104.

When used in connection with writing data into memory, a de-skewer output 114 provides a skewed data signal to the second input 94 of the first multiplexer 90. When used in connection with reading data from memory, the de-skewer output 114 provides the skewed data signal to whatever entity requested the data to be read.

As discussed in connection with FIG. 2, the amount of skew is determined during the training procedure 16, which may be initially performed before the operating procedure 18. Some practices have separate read-training and write-training procedures. During the read-training procedure, optimal compensation skews for use in connection with reading from memory 52 are determined. During the write-training procedure, optimal compensation skews to be used in connection with writing into memory 52 are determined.

Preferably, the read-training procedure is performed first, followed by the write-training procedure. This means that the optimal compensation skews derived from the read-training procedure can be used for reading values during the comparison step 26. Thus, results of the write-training procedure depend at least in part on results of the read-training procedure.

Some implementations have other differences between read-training and write-training. For example, the write-training procedure 16 described above is performed based on a round-trip comparison between a value written to memory 52 and a value read from memory 52. In contrast, the read-training procedure can be performed by simply making use of any data pattern available from the memory 52. This is because the data-communication circuit 84 does not need to write a value and then read it back in for comparison. Instead, read-training can be carried out by reading the data pattern and locating the timing of the actual leading-transition interval 10 and trailing-transition interval 14 for each bit over the compensation range of the delay line. This can be done by oversampling the data signal to locate leading and trailing edges of a single bit, and use the specific locations of those edges to determine the optimal compensation skew values. The oversampling can be performed based on the incoming strobe signal corresponding to the data signal. For example, the oversampling may include sampling using multiple time-shifted versions of the strobe signal, as described in more detail in U.S. patent application Ser. No. 14/046,879.

In some implementations, the read-training is initially performed before normal operation begins, using a pre-defined test data pattern written into the memory, or provided by the memory as a built-in pattern. Additionally, the read-training procedure can also be carried out during normal operation of the memory using any data pattern that happens to be read from the data lines. An advantage of being able to carry out read-training during normal operation by making use of any data pattern is the ability to periodically re-train during operation without needing to suspend normal operations between the memory controller 50 and the memory 52. This re-training may be useful to obtain updated compensation skew values that have changed due to a temperature and voltage change, for example.

When carrying out a read operation, the receiver 100 is active and the transmitter 88 is inactive. The control logic 96 selects the first input 102 of the second multiplexer 104. As a result, the data bit that has just been read passes through the de-skewer 110, which then delays it by some predetermined amount. The skewed data bit that has just been read also happens to be provided to the second input of the first multiplexer 90. However, since the transmitter 88 is inactive, this has no effect.

When carrying out a normal write-operation, the receiver 100 is inactive and the transmitter 88 is active. The control logic 96 selects the first input 92 of the first multiplexer 90. As a result, the nominal data-bit is placed on the data line 86.

When carrying out a skewed write-operation, the receiver 100 is inactive and the transmitter 88 is active. The control logic 96 selects the second input 94 of the first multiplexer 90 and the second input 106 of the second multiplexer 104. This means that the signal placed on the data line 86 will be the output of the de-skewer 110. As it turns out, since the second input 92 receives the nominal data-bit, the output of the de-skewer 110 will be a skewed data-bit. As a result, a skewed data-bit is placed on the data line 86.

The data-communication circuit 84 thus offers the advantage of re-using the de-skewer 110 for both read and write operations. This saves considerable die space and reduces overall power consumption.

The control logic 96 also has the ability to control what compensation skews are used for read operations and write operations. In a compensation re-use mode, the control logic 96 selects the compensation skews determined during the read-training procedure for both read operations and write operations. Because much of the route used by the data lines as they traverse the hardware between the memory controller 50 and the memory 52 is bidirectional, path length difference for reading and writing will be substantially identical. This means that the compensation skews for reading can also provide improved setup and hold time margin when they are re-used for writing. There may be some difference between the optimal compensation skews for reading and writing, which come from differences in the circuitry of the data lines that is not in common for both transmission and reception, but the reading compensation skews may be adequate for writing in some cases.

Having described the invention, and a preferred embodiment thereof, what is claimed as new, and secured by Letters Patent is:

1. An apparatus for controlling a memory, said apparatus comprising: a memory controller, mode-dependent circuitry capable of switching between a writing mode and a reading mode and whose function depends on whether it is in said writing mode or said reading mode, and an interface to data lines connecting said memory controller to said memory, wherein each of said data lines carries a signal that corresponds to a bit of a byte that is to be written to said memory, wherein said interface comprises, for each of said data lines, circuitry for transmission of a bit to be written into said memory via said data line, wherein said interface comprises, for each of said data lines, a data de-skewer, wherein for each of said data lines, said data de-skewer is configured to receive a first data signal provided by said mode-dependent circuitry in a writing mode, wherein said first data signal is a signal that represents a bit that is to be written into said memory, wherein each of said data lines is associated with an inherent skew, wherein said data de-skewer applies a compensation skew to said first data signal to generate a second data signal in said writing mode, wherein an extent of said compensation skew is selected to increase a likelihood that said second data signal will be sampled by said memory during a data-valid window thereof, and wherein said data de-skewer is further configured to receive a first data bit from said mode-dependent circuitry that, in a reading mode, is connected to a portion of said interface configured to receive from said data line a signal indicative of a bit that has been read from said memory and configured to skew said first data bit in said reading mode.

2. The apparatus of claim 1, wherein a sum of said extent of said compensation skew and said inherent skew of said first data signal equals a total skew, wherein said extent is selected to minimize a difference between said total skew and a common skew, and wherein said common skew is common to all bits in said byte.

3. The apparatus of claim 1, further comprising a strobe de-skewer, wherein said strobe de-skewer is configured to receive a first strobe, wherein said strobe de-skewer is further configured to output a second strobe, wherein said second strobe that is output by said strobe de-skewer is to be placed on a strobe line, wherein said strobe de-skewer is configured to skew said first strobe to an extent selected to maximize a likelihood that said second strobe will cause sampling of all data bits on said data lines during a data-valid window that is common to all of said data bits on said data lines.

4. The apparatus of claim 3, wherein said strobe de-skewer is configured to skew said first strobe by a value that is midway between a highest and lowest skew value of said strobe de-skewer.

5. The apparatus of claim 4, wherein said highest and lowest skew value of said strobe de-skewer and a highest and lowest skew value of said data de-skewer are the same.

6. The apparatus of claim 1, wherein said mode-dependent circuitry comprises a multiplexer having an output that is connected to an input of said data de-skewer, wherein said multiplexer has a first input and a second input, wherein said first input of said multiplexer is connected to said portion of said interface configured to receive from said data line a signal indicative of a bit that has been read from said memory, wherein said second input is configured to receive said first data signal, wherein said de-skewer has an output that is selectively connected to said data line so that said second data signal can be placed on said data line, wherein said first input of said multiplexer is selected when said memory controller is reading data from said memory in said reading mode, and wherein said second input of said multiplexer is selected when said memory controller is writing data into said memory in said writing mode.

7. The apparatus of claim 1, further comprising a multiplexer having a first input, a second input, and an output, wherein said first input is configured to receive said first data signal, wherein said second input is configured to receive said second data signal, and wherein said output connects to circuitry configured for placing one of said first data signal and said second data signal on said data line for writing into said memory.

8. The apparatus of claim 1, further comprising a multiplexer having a first input, a second input, and an output, wherein said first input is configured to receive said first data signal, wherein said second input is configured to receive a signal that has been read from memory and that has been delayed, and wherein said output connects to circuitry that, when enabled, is configured for transmitting to said memory one of said first data signal and said signal that has been read from memory.

9. The apparatus of claim 1, further comprising a first multiplexer included in said-mode dependent circuitry, and a second multiplexer, wherein said first multiplexer comprises an output, a first input, and a second input, wherein said output of said first multiplexer is connected to an input of said data de-skewer, wherein said first input of said first multiplexer is connected to said data line to receive a signal indicative of a bit that has been read from said memory, wherein said second input of said first multiplexer is configured to receive said first data signal, wherein said de-skewer has an output that is selectively connected to said data line so that said second data signal can be placed on said data line, wherein said first input of said first multiplexer is selected when said memory controller is reading data from said memory in said reading mode, wherein said second input of said first multiplexer is selected when said memory controller is writing data into memory in said writing mode, wherein said second multiplexer comprises a first input, a second input, and an output, wherein said first input of said second multiplexer is configured to receive said first data signal, wherein said second input of said second multiplexer is configured to receive said second data signal, and wherein said output of said second multiplexer connects to circuitry configured for placing one of said first data signal and said second data signal on said data line for writing into said memory.

10. A method for controlling a memory, said method comprising: receiving, by mode-dependent circuitry in a reading mode, the mode-dependent circuitry capable of switching between a writing mode and said reading mode and whose function depends on whether it is in said writing mode or said reading mode, a first data signal that has been read from said memory, at a first de-skewer, applying a read-compensation skew to said first data signal in said reading mode, receiving, by said mode-dependent circuitry in a writing mode, a second data signal that represents a bit of a byte that is to be written to said memory, selecting a write-compensation skew, and at said first de-skewer, skewing said second data signal by said selected write-compensation skew in said writing mode, thereby generating a third data signal, wherein selecting said write-compensation skew comprises selecting a skew that increases a likelihood that said third data signal will be sampled during a data-valid window thereof.

11. The method of claim 10, wherein selecting said write-compensation skew comprises selecting said write-compensation skew to maximize an extent to which all third data signals associated with said byte have overlapping data-valid windows.

12. The method of claim 10, wherein selecting said write-compensation skew comprises determining a compensation skew that, when added to an inherent skew in said data signal, results in a constant that is the same for all of said second data signals associated with said byte.

13. The method of claim 10, further comprising, for each of a set of candidate compensation skews, applying said candidate compensation skew to data, writing said data into memory, reading said data back from memory, determining that said data read back from memory fails to match said data that was written into memory, and based on said determination, removing said compensation skew from said set of candidate compensation skews.

* * * * *